(12) United States Patent
Machida et al.

(10) Patent No.: US 10,228,997 B2
(45) Date of Patent: Mar. 12, 2019

(54) MEMORY DEVICE AND DATA TRANSPORT METHOD

(71) Applicant: TOSHIBA MEMORY CORPORATION, Minato-ku (JP)

(72) Inventors: Yuuki Machida, Fujisawa (JP); Yasuo Kudo, Higashiyamato (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 222 days.

(21) Appl. No.: 15/256,010

(22) Filed: Sep. 2, 2016

(65) Prior Publication Data

US 2017/0262225 A1    Sep. 14, 2017

Related U.S. Application Data

(60) Provisional application No. 62/305,724, filed on Mar. 9, 2016.

(51) Int. Cl.
| | | |
|---|---|---|
| *G06F 11/07* | (2006.01) | |
| *G06F 13/16* | (2006.01) | |
| *G11C 16/04* | (2006.01) | |
| *G11C 16/26* | (2006.01) | |

(52) U.S. Cl.
CPC ......... *G06F 11/0793* (2013.01); *G06F 13/16* (2013.01); *G11C 16/0483* (2013.01); *G11C 16/26* (2013.01)

(58) Field of Classification Search
CPC .................................................. G06F 11/1012
USPC ....................................................... 713/168
See application file for complete search history.

(56) References Cited

U.S. PATENT DOCUMENTS

| | | | | |
|---|---|---|---|---|
| 4,967,377 | A | * 10/1990 | Masuda ................. | G03G 15/50 399/11 |
| 8,564,093 | B2 | 10/2013 | Kuroda et al. | |
| 2003/0021244 | A1* | 1/2003 | Anderson ......... | H04M 1/72522 370/329 |
| 2008/0154997 | A1* | 6/2008 | Aton ........................ | G09B 5/00 708/130 |
| 2013/0132792 | A1* | 5/2013 | Yamaki ............... | G06F 11/1048 714/755 |
| 2013/0182506 | A1* | 7/2013 | Melik-Martirosian ..................... | G11C 16/10 365/185.18 |
| 2018/0006466 | A1* | 1/2018 | Takahashi ............... | H02J 5/005 |

FOREIGN PATENT DOCUMENTS

| | | |
|---|---|---|
| JP | 2008-40516 | 2/2008 |
| JP | 5325495 | 10/2013 |
| JP | 2015-192069 | 11/2015 |

\* cited by examiner

*Primary Examiner* — Min Huang
(74) *Attorney, Agent, or Firm* — Oblon, McClelland Maier & Neustadt, L.L.P.

(57) ABSTRACT

According to one embodiment, a memory device is configured to be mounted on a substrate of a host device. The memory device includes a non-volatile memory, a controller circuit, and a wireless communication circuit. The controller circuit is configured to perform data transfer between the host device and the non-volatile memory. The wireless communication circuit is configured to transmit data read from the non-volatile memory with wireless communication, after the controller circuit is set in a state where the data transfer cannot be performed.

18 Claims, 5 Drawing Sheets

US 10,228,997 B2

MEMORY DEVICE AND DATA TRANSPORT METHOD

CROSS-REFERENCE TO RELATED APPLICATIONS

This application is based upon and claims the benefit of priority from U.S. Provisional Application No. 62/305,724, filed on Mar. 9, 2016; the entire contents of which are incorporated herein by reference.

FIELD

Embodiments described herein relate generally to a memory device and a data transport method.

BACKGROUND

There has been known a memory device that is mounted on a substrate. When the substrate having the memory device mounted thereon is damaged, there is a case where data reading from a non-volatile memory in the memory device becomes difficult.

DETAILED DESCRIPTION

In general, according to one embodiment, a memory device is configured to be mounted on a substrate of a host device. The memory device includes a non-volatile memory, a controller circuit, and a wireless communication circuit. The controller circuit is configured to perform data transfer between the host device and the non-volatile memory. The data transfer is performed upon a request from the host device. The wireless communication circuit is configured to transmit data read from the non-volatile memory with wireless communication, after the controller circuit is set in a state where the data transfer cannot be performed.

Exemplary embodiments of a memory device and a data transport method will be explained below in detail with reference to the accompanying drawings. The present invention is not limited to the following embodiments.

(First Embodiment)

Figure 1:
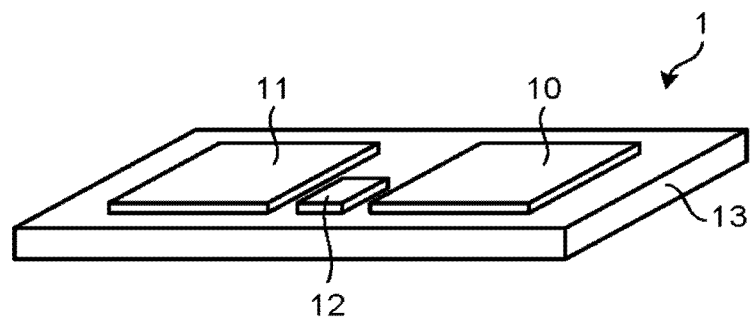
FIG. 1 is a perspective view illustrating relevant parts of a memory device according to a first embodiment.
Figure 2:
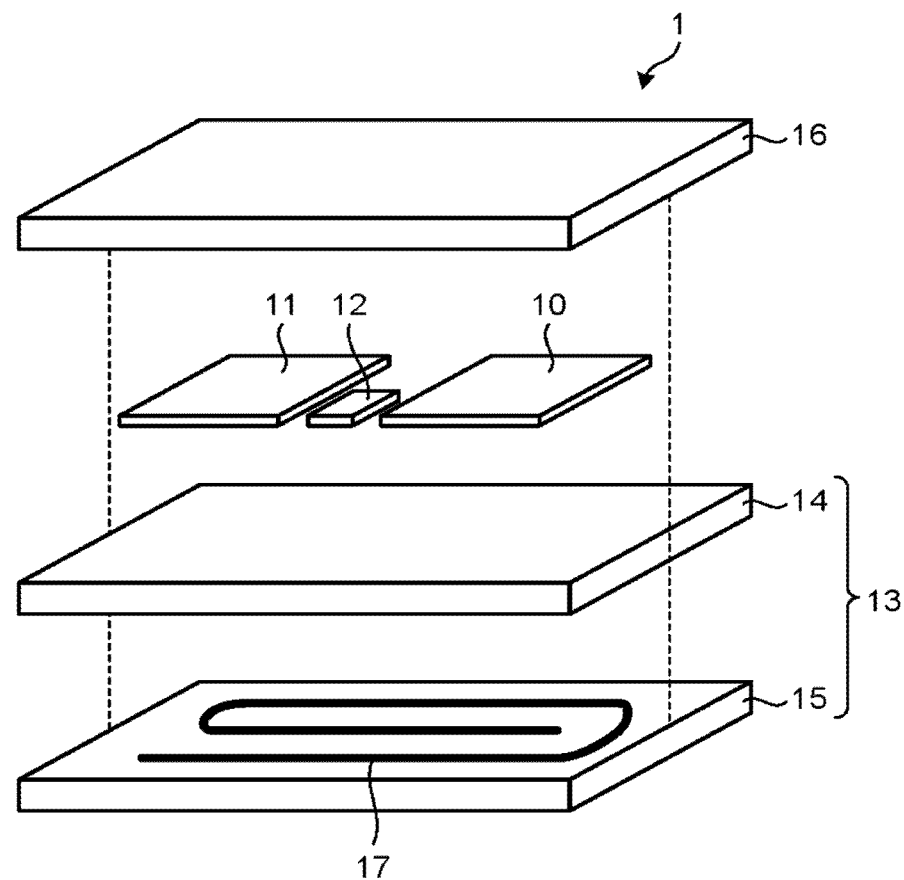
FIG. 2 is a perspective view illustrating respective elements of the memory device according to the first embodiment.

FIG. 1 is a perspective view illustrating relevant parts of a memory device according to a first embodiment. FIG. 2 is a perspective view illustrating respective elements of the memory device according to the first embodiment. A memory device 1 is, for example, an SSD (Solid State Drive) of a BGA (ball grid array) package type.

The memory device 1 can be used by being incorporated in an electronic device as a host device, such as a personal computer. The memory device 1 is directly mounted on a printed circuit board that is a component of the electronic device. The printed circuit board is, for example, a motherboard. The memory device 1 functions as, for example, an external storage device of a personal computer. The electronic device having the memory device 1 incorporated therein is not limited to a personal computer, and can be any electronic device such as a mobile device.

The memory device 1 includes a NAND flash memory (hereinafter abbreviated as NAND) 10 as a non-volatile memory, a memory controller 11 as a controller circuit, and a wireless chip 12 as a wireless communication circuit. The NAND 10, the memory controller 11, and the wireless chip 12 are mounted on the surface of a substrate 13.

A package 16 molds the substrate 13 on which the NAND 10, the memory controller 11, and the wireless chip 12 are mounted. FIG. 1 illustrates a state where the NAND 10, the memory controller 11, and the wireless chip 12 are mounted on the substrate 13.

The substrate 13 is constituted by laminating a plate 14 having a wiring circuit (not illustrated) formed thereon on a plate 15 having an antenna 17 formed thereon. The antenna 17 is an antenna for data transmission via wireless communication. A connection terminal (not illustrated) connected to a wire of a printed circuit board is provided on the back surface of the substrate 13. The laminating order of the plates 14 and 15 can be changed as appropriate. The antenna 17 can be formed on the package 16, instead of being formed on the substrate 13.

The NAND 10 is constituted as a memory chip. The NAND 10 holds user data transferred from a host device and management information of the memory device 1. Further, the NAND 10 stores therein firmware that operates a control circuit, which is a main control unit of the memory device 1.

The memory controller 11 is a chip that controls the entirety of the memory device 1. The memory controller 11 performs data transfer between the host device and the NAND 10. Various types of commands and data are input from the host device to the memory controller 11 via the connection terminal and the wire of the printed circuit board provided on the back surface of the substrate 13. The memory controller 11 performs command processing. The memory controller 11 performs data writing to the NAND 10 and data reading from the NAND 10 according to commands.

The wireless chip 12 is a chip that performs wireless communication using the antenna 17. The wireless chip 12 has a near-field wireless communication function of the NFC (Near Field Communication) standard. Other standards such as Bluetooth™ Low Energy or Transfer Jet™ can be employed for the near-field wireless communication function.

Figure 3:
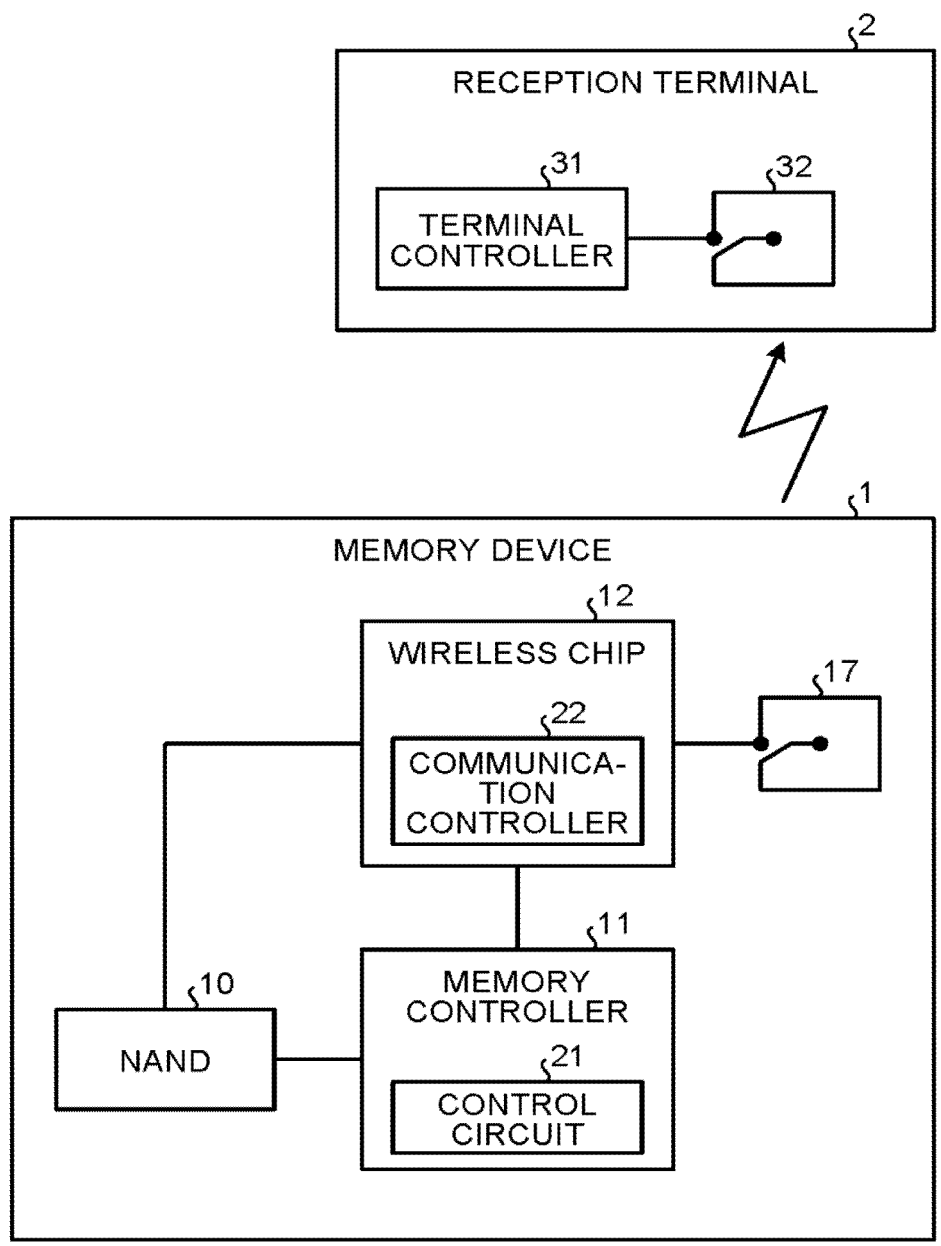
FIG. 3 is a block diagram of the memory device and a reception terminal illustrated in FIG. 1.

FIG. 3 is a block diagram of the memory device 1 and a reception terminal 2. Power is supplied to the wireless chip 12 after data reading, via the connection terminal of the substrate 13, from the NAND 10 upon a request from the host device is invalidated. The wireless chip 12 transports the data stored in the NAND 10 to the reception terminal 2 by using the power supplied the wireless chip 12. The case where data reading upon a request from the host device is invalidated is, for example, a case where a printed circuit board of the host device is damaged.

During a time period when data reading upon a request from the host device can be performed normally, power supply to the wireless chip 12 is stopped, and the wireless chip 12 is assumed to be in a state where its data transporting function is suspended. The function suspended state of the wireless chip 12 is canceled after data reading upon a request from the host device is invalidated. The wireless chip 12 transports data by using the power supplied thereto, after the function suspended state is canceled. The means for suspending the data transport can be any methods other than stopping of power supply.

The memory controller 11 includes a control circuit 21 as a main control unit of the memory device 1. The control circuit 21 generally controls respective constituent elements of the memory device 1. For example, the control circuit 21 is a microcomputer unit including a CPU (Central Processing Unit). The CPU realizes functions of the control circuit 21 by executing firmware loaded from the NAND 10.

The wireless chip 12 includes a communication controller 22 as a controller circuit. The communication controller 22 performs data transport including data reading from the NAND 10 and data transmission to the reception terminal 2. For example, the communication controller 22 is a microcomputer unit including a CPU. The CPU realizes a data transport function by executing firmware loaded from the NAND 10.

During a state where an operation upon a request from the host device can be performed, the memory controller 11 continues a predetermined signal output to the wireless chip 12. The wireless chip 12 cancels a function suspended state upon stopping of the signal output.

The reception terminal 2 as a reception device includes a near-field wireless communication function of a standard that is common to that of the wireless chip 12. By approximating the reception terminal 2 to the memory device 1 up to the distance between the memory device 1 and the reception terminal 2 in which wireless communication can be made, the reception terminal 2 can receive data transmitted from the memory device 1.

The reception terminal 2 includes a terminal controller 31 as a controller circuit and an antenna 32. The antenna 32 is an antenna for data reception via wireless communication. The terminal controller 31 receives data transmitted from the memory device 1 via the antenna 32.

The terminal controller 31 stores received data in, for example, a unit such as an external storage device or a storage medium (both not illustrated) in the reception terminal 2. The terminal controller 31 can transmit the stored data to other devices with an arbitrary method. The terminal controller 31 can transmit the received data directly to other devices. For example, the terminal controller 31 is a microcomputer unit including a CPU. The CPU realizes a data reception function by executing firmware loaded from the external storage device in the reception terminal 2.

The reception terminal 2 supplies power to the wireless chip 12 by so-called wireless power transmission, by which power is transmitted without using a connector or the like. When a current is sent to the antenna 32 of the reception terminal 2 in a state where the reception terminal 2 is approximated to the memory device 1, an induced electromotive force is generated in the antenna 17 of the memory device 1, using a magnetic flux generated from the antenna 32 as a medium. The electromotive force generated by electromagnetic induction is supplied to the wireless chip 12. The wireless power transfer from the reception terminal 2 to the wireless chip 12 can be performed with any methods other than electromagnetic induction.

If power is supplied from an external power source being connected to the wire of the memory device 1 to the wireless chip 12, a connector for connection to the external power source is provided in the memory device 1. By making power supply to the wireless chip 12 with wireless power transmission possible, the memory device 1 does not need to include a connector for connection to the external power source, and thus the number of components of the memory device 1 can be reduced.

The reception terminal 2 is a dedicated electronic device that performs reception of data from the memory device 1 and holding of received data or transmission thereof to other devices. For example, the reception terminal 2 is provided to users from a vendor of the memory device 1. The reception terminal 2 can be, other than a dedicated electronic device, any type of electronic device having a wireless communication function such as a mobile device. The vendor can provide an application for causing an electronic device to function as the reception terminal 2 to users. By employing wireless communication for data transport from the wireless chip 12, data stored in the memory device 1 can be easily transported to the reception terminal 2.

If data is taken out by connecting a data reading device to the wire of the memory device 1, a terminal for connecting the device to the wire is provided in the memory device 1 or on the printed circuit board. Around the memory device 1, there is provided a space for placing the device in a position where the device can be connected to the terminal. In the present embodiment, because a terminal for data reading and a space therefor are not required, the number of components of the memory device 1 and the printed circuit board can be reduced, and the areas of the memory device 1 and the printed circuit board can be also reduced. If a data reading device is connected in a wired manner, there are limitations on, not only the space on a substrate, but also the height of components around the memory device 1 and the layout of these components. In the present embodiment, because such limitations can be eliminated, the flexibility of the layout of the memory device 1 and the printed circuit board can be increased.

If data reading is performed after detaching the memory device 1 from the printed circuit board, due to damage at the time of detaching, the data stored in the NAND 10 may be lost. According to the present embodiment, the memory device 1 protects its data from being lost, and the data can be taken out safely.

By employing near-field wireless communication as the method of wireless communication, the memory device 1 and the reception terminal 2 can prevent interception of data from the NAND 10 by a remote external device. It is preferable that data that can be transported from the memory device 1 to the reception terminal 2 is limited to user data among information to be stored in the NAND 10. Due to this limitation, it is possible to block unnecessary disclosure of data, such as management information, other than user data.

Figure 4:
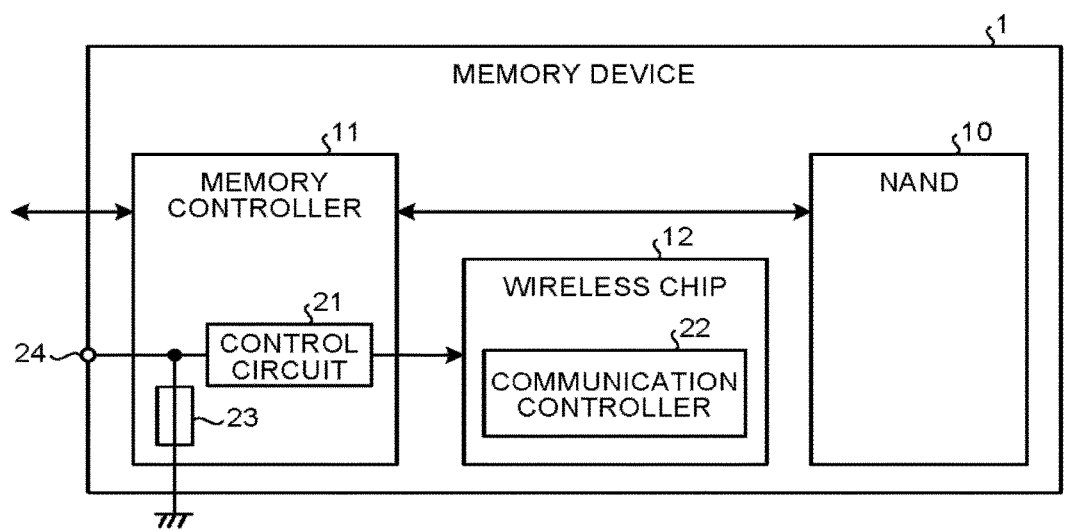
FIG. 4 is an explanatory diagram of an operation of the memory device illustrated in FIG. 1.

FIG. 4 is an explanatory diagram of an operation of the memory device 1. A fuse 23 is connected to a power source path to the memory controller 11. The fuse 23 constitutes a mechanism by which the power source path is disconnected when a voltage larger than a rated voltage is applied to the fuse 23. In FIG. 4, a part in the power source path where the fuse 23 is provided is illustrated.

A terminal 24 is provided, for example, on the exterior of the memory device 1. The terminal 24 is connected to the fuse 23. The terminal 24 can be provided on a printed circuit board of a host device.

An operation of the memory device 1 when data reading upon a request from a host device can be performed normally is described here. When the host device is being operated normally, power supply to the memory controller 11 is continued because the fuse 23 is kept to be a connected state. The memory controller 11 writes data received from the host device into the NAND 10, and transmits data read from the NAND 10 to the host device. Power supply to the wireless chip 12 is stopped here.

During a period when connection of the fuse 23 is maintained, the memory controller 11 is set to be a valid state where the memory controller 11 is operable. The control circuit 21 continues an output of a signal indicating that the memory controller 11 is in a valid state. During a period when the signal output by the control circuit 21 is continued, the wireless chip 12 is set to be a function suspended state.

For example, a switch (not illustrated) is provided in a power supply path from the antenna 17 to the wireless chip 12, and during a period when a signal is output from the control circuit 21, the switch is set in a disconnected state (OFF). Due to this configuration, when the memory controller 11 is in a valid state, even if the reception terminal 2 is approximated to the memory device 1, the wireless chip 12 maintains a function suspended state.

Next, an operation of the memory device 1 after data reading upon a request from a host device is invalidated is described. For example, it is assumed that data reading from the memory device 1 by control of the host device is invalidated due to damage on a printed circuit board. As an example, when the fuse 23 is disconnected by a user operation, the memory device 1 starts an operation for data transport.

The fuse 23 is disconnected when a voltage equal to or larger than a rated voltage is applied from an external power source (not illustrated) that is connected to the terminal 24. The external power source is provided in an external device other than the memory device 1 and the host device. For example, the external device can be the reception terminal 2.

Power supply to the memory controller 11 is stopped due to disconnection of the fuse 23, and then the memory controller 11 shifts to an invalid state where the memory controller 11 cannot be operated. The shifting of the memory controller 11 from a valid state to an invalid state is assumed to be irreversible.

The control circuit 21 stops an output of a signal indicating a valid state. The function suspended state of the wireless chip 12 is canceled when the output of the signal is stopped. For example, when the output of the signal from the control circuit 21 is stopped, a switch in a power supply path from the antenna 17 to the wireless chip 12 is switched from OFF to a connected state (ON). By securing the power supply path from the antenna 17 to the wireless chip 12, the function suspended state of the wireless chip 12 is canceled.

Power is supplied from the reception terminal 2 to the wireless chip 12 by approximating the reception terminal 2 to the memory device 1. The communication controller 22 starts an operation for data transport upon supply of power thereto. The communication controller 22 reads data from the NAND 10. The communication controller 22 transmits data to the reception terminal 2 that is in a state where the memory device 1 approximates to the reception terminal 2.

Figure 5:
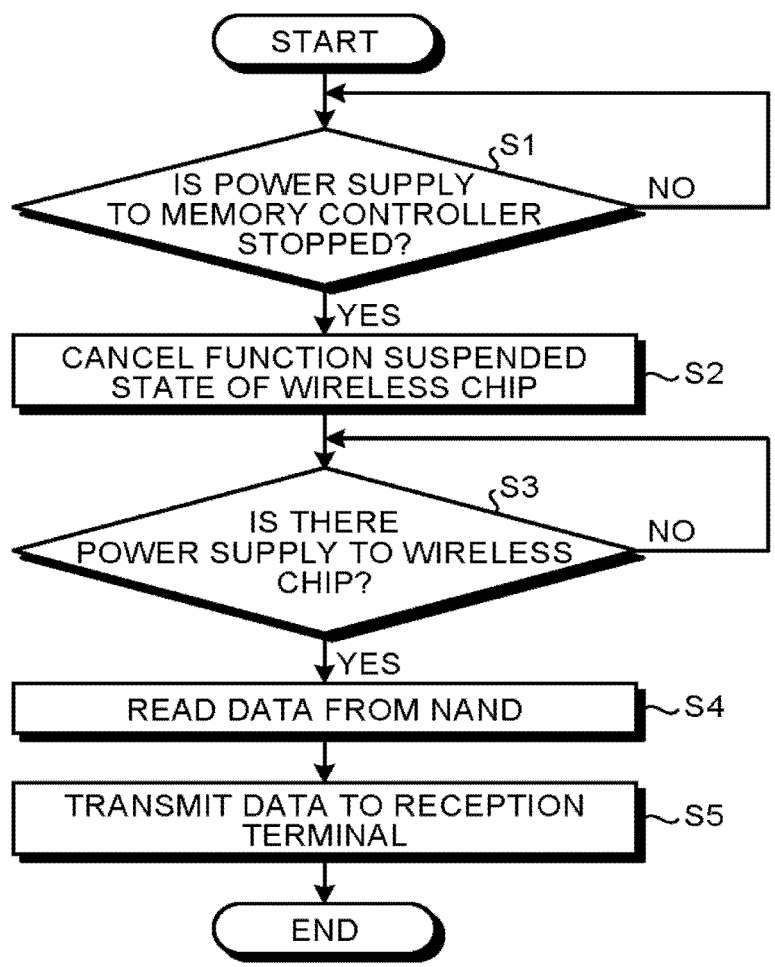
FIG. 5 is a flowchart illustrating an operation procedure of the memory device illustrated in FIG. 1.

FIG. 5 is a flowchart illustrating an operation procedure of the memory device 1. For example, in a case where data reading from the memory device 1 by a host device is invalidated and a user of the memory device 1 wishes fetching of the data stored in the memory device 1, the user connects an external power source (not illustrated) to the terminal 24. The external power source applies a voltage to the fuse 23 via the terminal 24.

The fuse 23 is disconnected by application of a voltage equal to or larger than a rated voltage from the external power source. When the fuse 23 is disconnected, power supply to the memory controller 11 is stopped (YES at S1). When the power supply is stopped, the memory controller 11 shifts from a valid state to an invalid state.

The control circuit 21 stops an output of a signal indicating a valid state. The function suspended state of the wireless chip 12 is canceled when the output of the signal from the control circuit 21 is stopped (S2). The wireless chip 12 enters an operable state if there is wireless power transmission from the reception terminal 2 when the function suspended state is canceled.

When power is supplied from the reception terminal 2 to the wireless chip 12 (YES at S3), the communication controller 22 reads data from the NAND 10 (S4). The communication controller 22 transmits data read from the NAND 10 to the reception terminal 2 (S5). With the above processes, the operation of the memory device 1 is ended.

The reception terminal 2 receives data transmitted from the memory device 1. For example, the reception terminal 2 stores the received data in the memory device 1 that is mounted on a new printed circuit board. Due to this process, data stored in the memory device 1 that is mounted on an unusable printed circuit board is transported to the memory device 1 on the new printed circuit board.

The wireless chip 12 is not limited to a wireless chip in which the function suspended state thereof is canceled when a predetermined signal from the control circuit 21 is stopped. For example, the function suspended state of the wireless chip 12 can be canceled on the basis of a predetermined signal from the reception terminal 2. It is also possible to have a configuration in which, for example, power supply due to wireless power transmission, which is caused by approximating the reception terminal 2 to the memory device 1, is started and then the function suspended state of the wireless chip 12 is canceled.

The memory device 1 causes the memory controller 11 to be an invalid state before an operation of the wireless chip 12 is started. The memory device 1 can prevent occurrence of an erroneous operation of the memory controller 11 caused by the operation of the wireless chip 12 or of short-circuit between components in the memory controller 11 and components on a printed circuit board.

By disconnecting the fuse 23 as a measure of shifting the memory controller 11 to an invalid state, power supply to the memory controller 11 is stopped structurally. Due to this structure, the memory device 1 can shift the memory controller 11 to an invalid state securely and irreversibly.

It is also possible that the memory device 1 shifts the memory controller 11 to an invalid state with a method other than disconnecting the fuse 23. It is also possible that, in the memory device 1, the power source path to the memory controller 11 can be disconnected by using elements other than the fuse 23.

Other than disconnecting the power source path, it is also possible that the memory controller 11 shifts to an invalid state by executing a predetermined command, for example. When a command as an invalidation request is input, the control circuit 21 performs a process of shifting the memory controller 11 to an invalid state. Also in this case, the shifting of the memory controller 11 from a valid state to an invalid state is assumed to be irreversible.

The terminal 24 is connected to a command input path to the control circuit 21. A command as an invalidation request is input from the terminal 24 to the control circuit 21. The command is input by the memory device 1 and an external device other than a host device. The external device can be the reception terminal 2, for example. Also in this case, the memory device 1 can shift the memory controller 11 to an invalid state.

It is also possible that, along with the shifting of the memory controller 11 to an invalid state, the memory device 1 can shift all connection terminals used for connection to a printed circuit board in the memory device 1 to an invalid state. Similarly to the case where the memory controller 11 is set to be an invalid state, the memory device 1 sets the connection terminals to be an invalid state by disconnection of a wire or a command input to the control circuit 21. The memory device 1 can prevent occurrence of short-circuit between the connection terminals and components on the printed circuit board caused by an operation of the wireless chip 12.

The memory device 1 can transport data in the NAND 10 to the reception terminal 2 not only in a case where the memory controller 11 is set to be an invalid state intentionally due to disconnection of the fuse 23, but also in a case where the memory controller 11 is set be an invalid state due to a factor such as breakage of the memory controller 11.

It is also possible that power is supplied to the wireless chip 12 with a method other than wireless power transmission from the reception terminal 2. For example, it is possible to supply power to the wireless chip 12 by connecting an external power source to a connector provided in the memory device 1. The external power source can be provided in the reception terminal 2, for example. Also in this case, the wireless chip 12 can perform data transport.

According to the first embodiment, the memory device 1 transmits data read from the NAND 10 to the reception terminal 2 with wireless communication from the wireless chip 12. Due to this configuration, data can be transported easily and safely from the memory device 1 that is mounted on a substrate of a host device.

(Second Embodiment)

Figure 6:
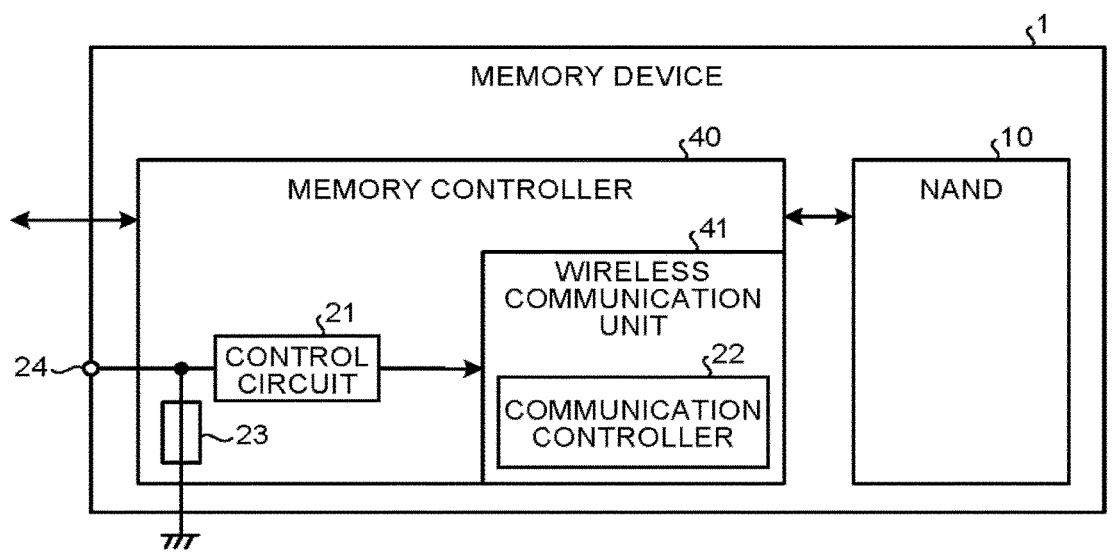
FIG. 6 is a block diagram of a memory device according to a second embodiment.

FIG. 6 is a block diagram of a memory device according to a second embodiment. Elements of the second embodiment identical to those of the first embodiment are denoted with like reference signs and redundant descriptions thereof will be omitted.

A memory controller 40 includes a wireless communication unit 41 as a wireless communication circuit. The wireless communication unit 41 is provided in a chip that constitutes the memory controller 40. The wireless communication unit 41 includes the communication controller 22.

An operation of the memory device 1 when data reading upon a request from a host device can be performed normally is described here. When the host device is operating normally, power supply to elements in the memory controller 40 other than the wireless communication unit 41 is continued when the fuse 23 is kept to be a connected state. Power supply to the wireless communication unit 41 is disconnected here.

During a period when connection of the fuse 23 is maintained, the memory controller 40 is set to be a valid state where the memory controller 40 is operable. The control circuit 21 continues an output of a signal indicating that the memory controller 40 is in a valid state. During a period when the output of the signal by the control circuit 21 is continued, the wireless communication unit 41 is set to be a function suspended state.

An operation of the memory device 1 after data reading upon a request from a host device becomes invalidated is described next. Power supply to elements in the memory controller 40 other than the wireless communication unit 41 is disconnected when the fuse 23 is disconnected, and the elements shift to an invalid state where the elements are inoperable.

The function suspended state of the wireless communication unit 41 is canceled when the output of the signal from the control circuit 21 is stopped. By causing the reception terminal 2 to approximate to the memory device 1, power is supplied from the reception terminal 2 to the wireless communication unit 41.

It is also possible that at least a part of processes for data transport from the NAND 10 to the reception terminal 2 is performed by the memory controller 40 instead of the communication controller 22. For example, the memory controller 40 can perform data reading from the NAND 10 to the wireless communication unit 41. Similarly to the wireless communication unit 41, power is supplied to an element in the memory controller 40, which performs data reading to the wireless communication unit 41. Similarly to the second embodiment, the memory controller 11 according to the first embodiment can perform at least a part of processes for data transport.

According to the second embodiment, the memory device 1 transmits data read from the NAND 10 to the reception terminal 2 with wireless communication from the wireless communication unit 41. Due to this configuration, the data can be transported easily and safely from the memory device 1 that is mounted on a substrate of a host device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device configured to be mounted on a substrate of a host device, the memory device comprising:
    a non-volatile memory;
    a controller circuit configured to perform data transfer between the host device and the non-volatile memory upon a request from the host device; and
    a wireless communication circuit configured to:
        transmit data read from the non-volatile memory with wireless communication, after the controller circuit is set in a state where the data transfer cannot be performed: and
        perform the wireless communication after power supply to the controller circuit is stopped.

2. The memory device according to claim 1, wherein the wireless communication circuit is operated using power supplied from a reception device that receives data transmitted with the wireless communication.

3. The memory device according to claim 1, wherein the wireless communication circuit is operated using power supplied with wireless power transmission.

4. The memory device according to claim 1, further comprising a fuse that is connected to a power source path to the controller circuit, wherein
    the controller circuit shifts to a state where the data transfer cannot be performed due to disconnection of the fuse.

5. The memory device according to claim 4, comprising a terminal that is connected to the fuse.

6. The memory device according to claim 1, wherein the controller circuit shifts to a state where the data transfer cannot be performed due to execution of an input command.

7. The memory device according to claim 6, comprising a terminal to which the command is input.

8. The memory device according to claim 1, wherein
the controller circuit outputs a predetermined signal when the data transfer can be performed, and
a function suspended state of the wireless communication circuit is canceled when an output of the signal is stopped.

9. The memory device according to claim 1, wherein the wireless communication circuit is provided in a chip that constitutes the controller circuit.

10. A method of transporting data from a memory device that is mounted on a substrate of a host device, the memory device including a non-volatile memory, a controller circuit that performs data transfer, and a wireless communication circuit, the method comprising:
reading data stored in the non-volatile memory to the wireless communication circuit after the memory device is set in a state where the data transfer between the host device and the non-volatile memory upon a request from the host device cannot be performed; and
transmitting read data from the wireless communication circuit with wireless communication,
wherein data stored in the non-volatile memory is read to the wireless communication circuit after power supply to the controller circuit is stopped.

11. The method according to claim 10, wherein
power is supplied from a reception device to the wireless communication circuit to operate the wireless communication circuit, and
data transmitted from the wireless communication circuit is received by the reception device.

12. The method according to claim 10, wherein power is supplied to the wireless communication circuit with wireless power transmission to operate the wireless communication circuit.

13. The method according to claim 10, wherein
a fuse that is connected to a power source path to the controller circuit is disconnected to shift the controller circuit to a state where the data transfer cannot be performed.

14. The method according to claim 13, wherein the fuse is disconnected by application of a voltage from a terminal that is connected to the fuse.

15. The method according to claim 10, wherein
when a command is executed in the controller circuit, the controller circuit shifts to a state where the data transfer cannot be performed.

16. The method according to claim 15, wherein the command input from a terminal that is connected to the controller circuit is executed.

17. The method according to claim 10, wherein
a predetermined signal is output from the controller circuit when the data transfer can be performed, and
a function suspended state of the wireless communication circuit is canceled when the output of the signal is stopped.

18. The method according to claim 10, wherein user data stored in the non-volatile memory is read to the wireless communication circuit.

* * * * *